United States Patent
Ju (10) Patent No.: US 9,326,387 B2
(45) Date of Patent: Apr. 26, 2016

(54) ELECTRICAL CONNECTOR AND MANUFACTURING METHOD THEREOF

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 280 days.

(21) Appl. No.: 14/094,376

(22) Filed: Dec. 2, 2013

(65) Prior Publication Data

US 2015/0085457 A1 Mar. 26, 2015

(30) Foreign Application Priority Data

Sep. 20, 2013 (CN) .......................... 2013 1 0427630

(51) Int. Cl.
*H05K 7/10* (2006.01)
*H05K 7/12* (2006.01)
*H05K 3/32* (2006.01)
*H05K 3/34* (2006.01)
*H01R 12/57* (2011.01)

(52) U.S. Cl.
CPC *H05K 3/32* (2013.01); *H01R 12/57* (2013.01); *H05K 3/3436* (2013.01); *H05K 2201/10189* (2013.01); *H05K 2201/10734* (2013.01); *H05K 2201/10962* (2013.01); *H05K 2203/128* (2013.01); *Y10T 29/49155* (2015.01)

(58) Field of Classification Search
USPC .......... 174/259–264; 361/767–774, 794–795, 361/803
See application file for complete search history.

(56) References Cited

U.S. PATENT DOCUMENTS

| 6,373,273 | B2* | 4/2002 | Akram .......... H01L 2924/01079 257/730 |
| 6,574,114 | B1* | 6/2003 | Brindle .............. G02B 6/12007 174/262 |
| 7,615,707 | B2* | 11/2009 | Lin ....................... H05K 3/0094 174/261 |
| 2004/0015114 | A1* | 1/2004 | Hay .......................... A61F 5/04 602/32 |

* cited by examiner

*Primary Examiner* — Tuan T Dinh
(74) *Attorney, Agent, or Firm* — Locke Lord LLP; Tim Tingkang Xia, Esq.

(57) ABSTRACT

An electrical connector for electrically connecting a first electronic element having protruding conductive portions in the bottom thereof to a second electronic element, includes an insulating body located below the first and above the second electronic element, a conductor, a solder pad disposed on the lower surface of the insulating body, and a conducting line disposed in the insulating body and conducting the conductor and the solder pad. Upper surface of the insulating body has accommodation holes. Aperture of the accommodation hole is greater than outer diameter of the conductive portion. Wall and bottom of the accommodation holes form the conductor. The accommodation hole has low-melting point liquid metal conductor. When the conductive portion enters the accommodation hole, the liquid metal adheres to the conductive portion, and forms a conductive path between the conductive portion and the conductor. A manufacturing method of the electrical connector.

20 Claims, 8 Drawing Sheets

ELECTRICAL CONNECTOR AND MANUFACTURING METHOD THEREOF

CROSS-REFERENCE TO RELATED APPLICATION

This non-provisional application claims priority under 35 U.S.C. §119(a) on Patent Application No. 201310427630.2 filed in P.R. China on Sep. 20, 2013, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector and a manufacturing method thereof, and more particularly to an electrical connector capable of implementing stable electrical connection and a manufacturing method thereof.

BACKGROUND OF THE INVENTION

An electrical connector is generally used for signal transmission between two electronic elements that are not electrically connected directly. For example, signal transmission between a chip module in a ball grid array (BGA) encapsulation form and a circuit board is implemented through a BGA electrical connector. The electrical connector includes an insulating body and a terminal disposed in the insulating body. The terminal is provided with an elastic contact portion. A solder ball of the chip module is pressed and connected to the elastic contact portion to implement electric contact. When the chip module or the electrical connector shakes under an external force, transient open circuit between the elastic contact portion of the terminal and the solder ball of the chip module easily occurs, thereby affecting signal transmission between the chip module and the circuit board.

Therefore, it is necessary to design a new electrical connector and a manufacturing method thereof to overcome the above problem.

SUMMARY OF THE INVENTION

In one aspect, the present invention is directed to an electrical connector thereof, which is capable of eliminating transient open circuit between an electronic element and an electrical connector, thereby improving the stability of electrical connection and signal transmission between the two.

In one embodiment, an electrical connector is provided for electrically connecting a first electronic element to a second electronic element. The bottom of the first electronic element has a plurality of protruding conductive portions. The electrical connector includes an insulating body, a solder pad and a conducting line. The insulating body is located below the first electronic element and above the second electronic element. The upper surface of the insulating body is provided with a plurality of accommodation holes. The aperture of the accommodation hole is greater than the outer diameter of the conductive portion. A side wall and a bottom of the accommodation hole are provided with a conductor. The solder pad is disposed on the lower surface of the insulating body to be electrically connected to the second electronic element. The conducting line is disposed in the insulating body and conducting the conductor and the solder pad. The accommodation hole is provided with low-melting point liquid metal to be electrically conducted with the conductor. When the conductive portion enters the accommodation hole, the low-melting point liquid metal adheres to and contacts with the conductive portion, so that the low-melting point liquid metal forms a conductive path between the conductive portion and the conductor.

As a further improvement of the above embodiment, the low-melting point liquid metal wraps the periphery of a contact area of the conductive portion, so as to isolate the contact area from being in contact with the air.

Further, the upper surface of the insulating body has an elastic sealing layer. When the first electronic element is pressed down, the elastic sealing layer is compressed to prevent the low-melting point liquid metal from leaking. The elastic sealing layer is provided with a plurality of through holes corresponding to the accommodation holes, for the conductive portions to pass through. When the first electronic element is pressed down, the upper and lower surfaces of the elastic sealing layer are closely attached to the lower surface of the first electronic element and the upper surface of the insulating body respectively.

Further, a cover covers the upper surface of the insulating body, and the cover seals openings of the accommodation holes. The portion of the cover corresponding to the accommodation hole is transparent.

Further, the insulating body further includes a penetration hole penetrating the lower surface of the insulating body. The penetration hole is in communication with the accommodation hole. The conducting line is disposed on the wall surface of the penetration hole.

Further, the penetration hole has a plug, so as to prevent the low-melting point liquid metal from leaking out of the accommodation hole downwards. The bottom of the plug does not exceed the lower surface of the insulating body downwards.

Optionally, the plug is made of a metal material, and the bottom of the plug extends downwards to form the solder pad.

Further, the low-melting point liquid metal adheres to and contacts with a solder ball disposed at the bottom of the first electronic element. A transition portion between the side wall and the bottom of the accommodation hole is arc-shaped. The depth of the accommodation hole is greater than the spherical radius of the solder ball.

In another embodiment, the accommodation hole is a blind hole, the insulating body is further provided with a penetration hole penetrating vertically through the insulation body, and the conducting line is disposed on the wall surface of the penetration hole, and is electrically connected to the conductor in the accommodation hole through a metal line.

In another aspect, the present invention is directed to a manufacturing method of an electrical connector. The electrical connector is used for electrically connecting a first electronic element to a second electronic element. The bottom of the first electronic element has a plurality of protruding conductive portions.

In one embodiment, the method includes:

s1. providing an insulating body, opening a plurality of accommodation holes on the upper surface of the insulating body, where the aperture of the accommodation hole is greater than the outer diameter of the conductive portion, and opening, in the insulating body, a plurality of penetration holes penetrating the lower surface of the insulating body;

s2. coating a layer of metal substrate on wall surfaces of the accommodation hole and the penetration hole, so as to form a conductor and a conducting line respectively, where the conducting line conducts the conductor, and the conducting line extends downwards to be electrically conducted with the second electronic element; and s3. placing low-melting point liquid metal in the accommodation hole, where the low-melting point liquid metal is electrically conducted with the metal layer, and the low-melting point liquid metal is used to be in contact with the conductive portion entering the accommodation hole.

As a further improvement of the above embodiment, in step s3, the low-melting point liquid metal is solidified into particles and then placed into the accommodation hole.

Further, in step s1, the penetration hole is opened below the accommodation hole and is in communication with the accommodation hole; in step s2, the metal layer is coated in the penetration hole first to form the conducting line; a plug is then provided, and the plug is plugged in the penetration hole to seal the bottom of the accommodation hole; and the metal layer is coated in the accommodation hole to form the conductor, where the conductor is electrically conducted with the conducting line.

As an improvement of the above embodiment, the plug is made of a metal material and is electrically conducted with the conducting line, and the plug extends downwards to the lower surface of the insulating body to form the solder pad so as to be electrically connected to the second electronic element.

As another improvement of the above embodiment, the conducting line extends downwards to the lower surface of the insulating body to form the solder pad so as to be electrically connected to the second electronic element.

The above embodiment further includes the following step: disposing an elastic sealing layer on the upper surface of the insulating body, where the elastic sealing layer is provided with a plurality of through holes corresponding to the accommodation holes, for the conductive portions to pass through.

The above embodiment further includes the following step: disposing a cover on the upper surface of the insulating body, where the cover seals openings of the accommodation holes.

Compared with the related art, in the present invention, the low-melting point liquid metal is disposed in the accommodation hole to be electrically conducted with the conductor, and when the conductive portion of the chip module enters the accommodation hole, the low-melting point liquid metal adheres to and contacts with the conductive portion, so that the low-melting point liquid metal forms a conductive path between the conductive portion and the conductor. By means of the manner of establishing a conductive path through the low-melting point liquid metal, when the first electronic element shakes slightly under an external force, the surface of the conductive portion is at least locally adhered with the low-melting point liquid metal, so that transient open circuit between the conductive portion and the electrical connector may be avoided, and the first electronic element still keeps electrical connection with the second electronic element through the conductor, thereby ensuring desirable signal transmission between the first electronic element and the second electronic element.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

As shown in FIGS. 1-6, as a first embodiment of the present invention, an electrical connector is used for electrically connecting a BGA chip module 200 to a circuit board 300. The bottom of the chip module 200 is provided with protruding conductive portions B. In this embodiment, the conductive portion B is solder balls B, and in other embodiments, it may also be a protruding copper pillar, or other protruding conductive materials and shapes.

Figure 1:
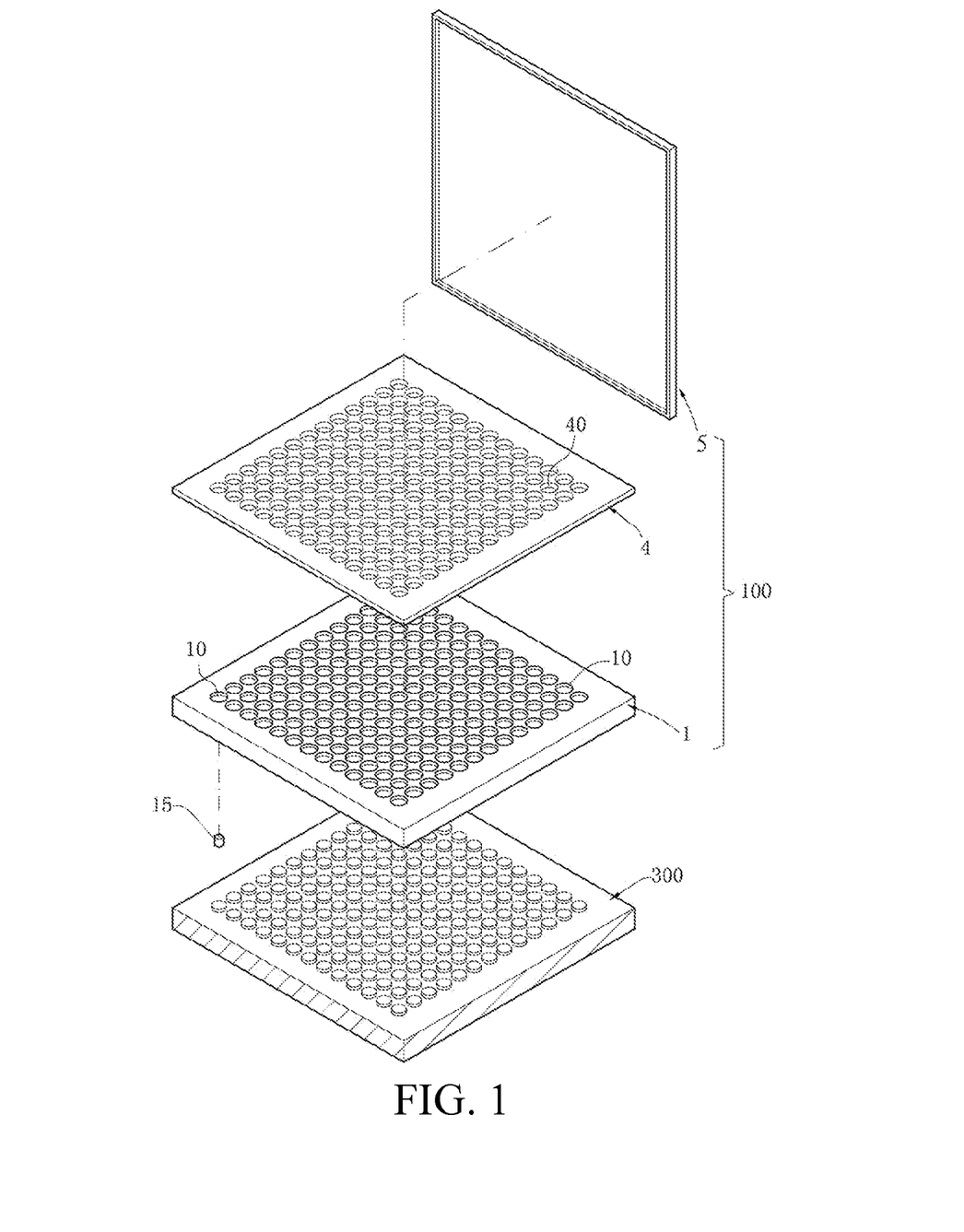
FIG. 1 is a three-dimensional exploded view of a first embodiment of an electrical connector according to one embodiment of the present invention.
Figure 2:
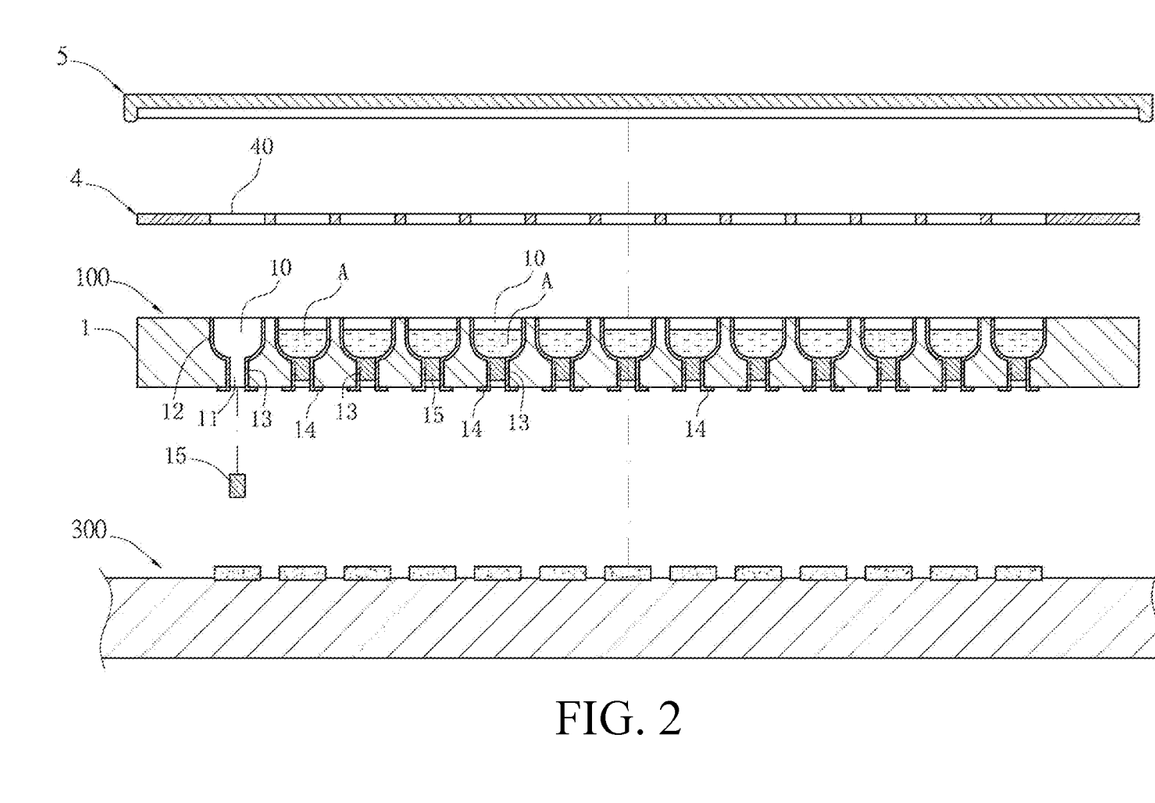
FIG. 2 is a sectional view of FIG. 1.
Figure 3:
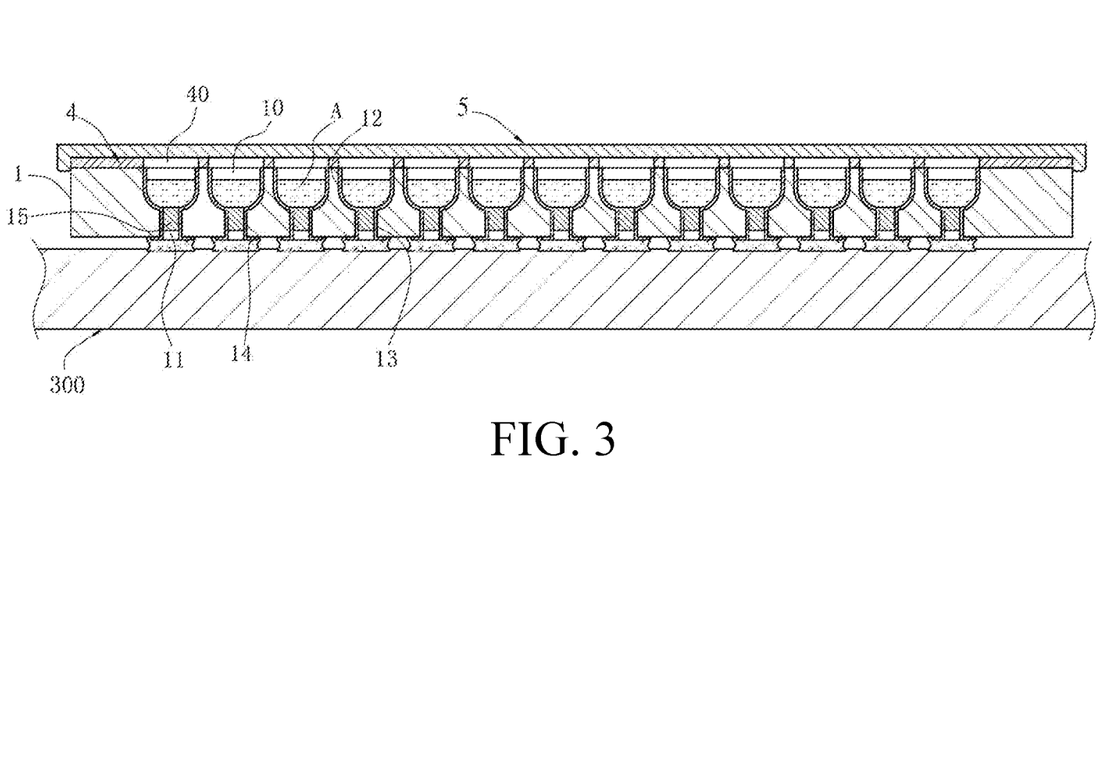
FIG. 3 is a schematic view of elements in FIG. 2 after being assembled.
Figure 4:
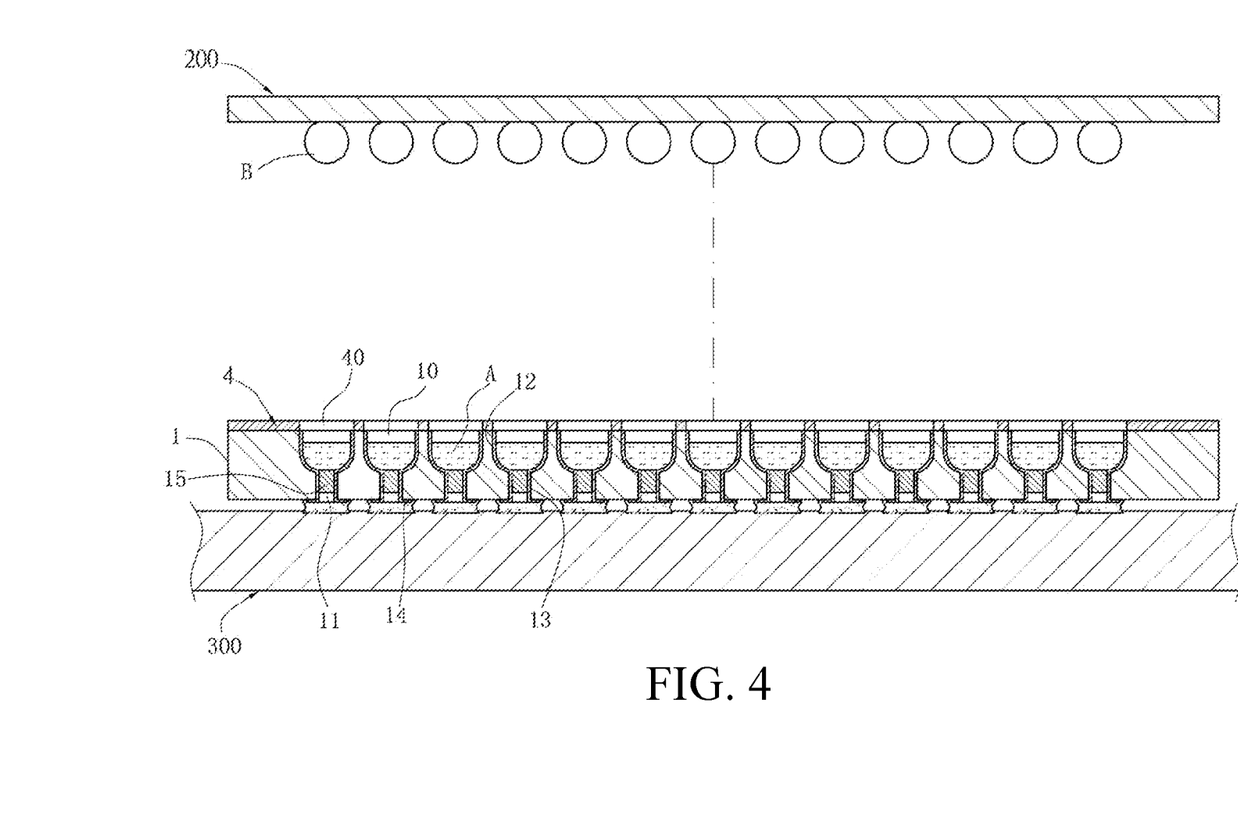
FIG. 4 is a schematic view of a chip module not being pressed downwards.

As shown in FIG. 2, the electrical connector includes an insulating body 1. The insulating body 1 has a plurality of accommodation holes 10 penetrating the upper surface of the insulating body 1, and a plurality of penetration holes 11 correspondingly located below the accommodation holes 10. The penetration holes 11 penetrate the lower surface of the insulating body 1 and are in communication with the accommodation holes 10. The depth of the accommodation hole 10 is greater than the spherical radius of the solder ball B on the chip module 200, and the aperture of the accommodation hole 10 is greater than the outer diameter of the solder ball B. The inner diameter of the accommodation hole 10 should be greater than the inner diameter of the penetration hole 11, so as to form a step at a junction of the two. In order to reduce the volume of the accommodation hole 10 as much as possible, an R angle is disposed at the bottom of the accommodation hole 10. That is to say, a transition portion between the side wall and the bottom of the accommodation hole 10 is set to be arc-shaped.

Referring to FIGS. 2-5, the side wall and the bottom of the accommodation hole 10 are provided with a conductor 12. The side wall of the penetration hole 11 is provided with a conducting line 13. The conducting line 13 is connected to the conductor 12. The conducting line 13 extends downwards to the lower surface of the insulating body 1 so as to form a solder pad 14 for being welded to the circuit board 300. A plug 15 is plugged in the penetration hole 11. The bottom of the plug 15 does not exceed the lower surface of the insulating body 1 downwards so that the solder pad 14 can be easily welded to the circuit board 300. The top of the plug 15 seals the bottom of the accommodation hole 10 so that a cup-shaped accommodation cavity is formed in the accommodation hole 10 by the conductor 12. The inner diameter of the accommodation cavity is slightly greater than the maximum diameter of the solder ball B on the chip module 200, and the depth of the accommodation cavity is greater than the spherical radius of the solder ball B so that most part of the solder ball B can enter the accommodation cavity. In other embodiments (not shown), the conductor 12 may extends downwards to the lower surface of the insulating body 1 for being welded to the circuit board 300 directly.

The accommodation cavity is provided with low-melting point liquid metal A, and the low-melting point liquid metal A is electrically conducted with the conductor 12. The low-melting point liquid metal A has a low melting point and is conductive, which is liquid at the room temperature, and may be composed of, for example, one element in indium, gallium, and tin, and may also be an alloy composed of two or three elements thereof. In this embodiment, gallium and indium in a proper proportion may be used to form a low-melting point alloy, for example, a gallium alloy containing 25% indium, which melts at 16° C., and if the temperature is higher than the melting point, gallium and indium can form the alloy automatically during mixing and grinding. When the amount of the low-melting point liquid metal A is little, the low-melting point liquid metal A is sporadically adhered to the solder ball B to form contact with the solder ball B. In order to avoid oxidation of a contact area of the solder ball B, the amount of the low-melting point liquid metal A may be increased, so that the low-melting point liquid metal A wraps the periphery of the contact area of the solder ball B, so as to isolate the contact area from being in contact with the air.

In this embodiment, as a preferred embodiment, a layer of elastic sealing layer 4 is disposed on the upper surface of the insulating body 1. The elastic sealing layer 4 has a plurality of through holes 40 corresponding to the accommodation holes 10, for the solder balls B to pass through. When the chip module 200 is pressed down, the upper and lower surfaces of the elastic sealing layer 4 are closely attached to the lower surface of the chip module 200 and the upper surface of the insulating body 1 respectively, thereby preventing the low-melting point liquid metal A of the accommodation hole 10 from leaking, further preventing the low-melting point liquid metal A in adjacent accommodation holes 10 from adhering to each other, and avoiding the short circuit phenomenon of the low-melting point liquid metal A in the adjacent accommodation holes 10. Further, a cover 5 further covers the elastic sealing layer 4, and the cover 5 seals openings of the accommodation holes 10. In order to facilitate perspective detection of optical equipment to see whether each of the accommodation holes 10 is provided with the low-melting point liquid metal A, the cover 5 is made of a transparent material. In other embodiments, the elastic sealing layer 4 may be disposed separately, or only the cover 5 is disposed.

Figure 5:
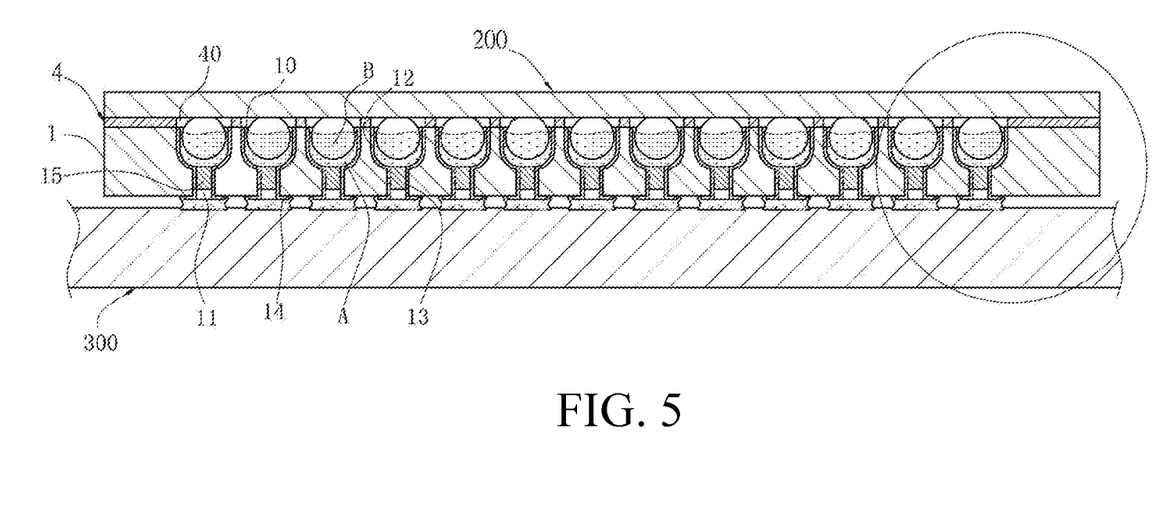
FIG. 5 is a schematic view of the chip module in FIG. 4 after being pressed downwards.
Figure 6:
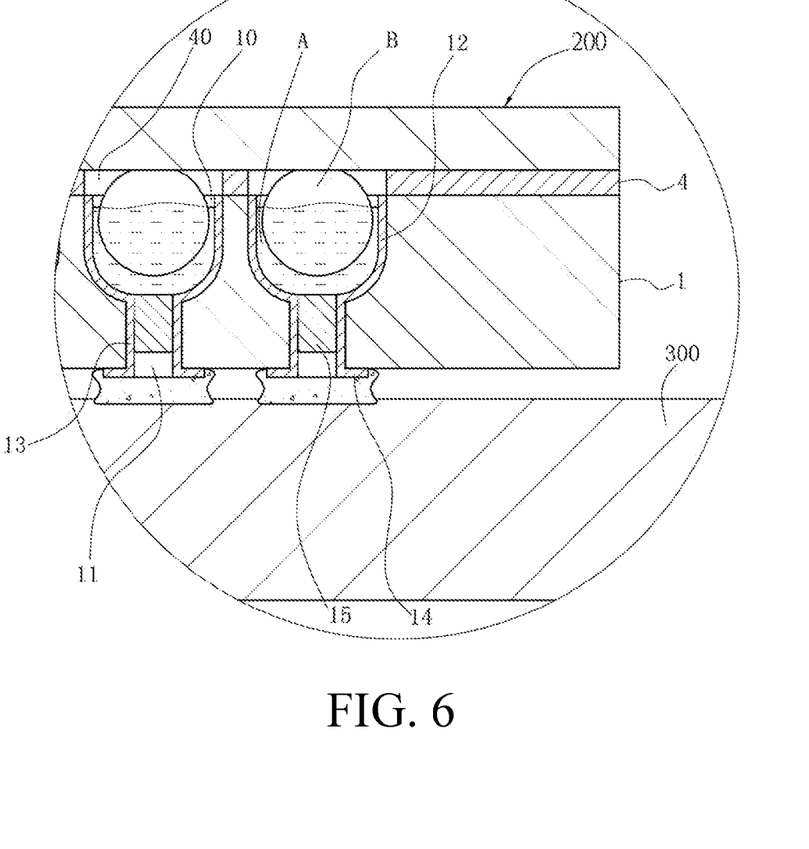
FIG. 6 is a partial enlarged view of FIG. 5.

As shown in FIG. 5 and FIG. 6, a use state of the electrical connector 100 according to one embodiment of the present invention is shown. Before use, the cover 5 is removed first, and then the chip module 200 is pressed downwards to the electrical connector 100. The solder ball B can enter the accommodation hole 10 downwards through the through hole 40. Specifically, the solder ball B enters the accommodation cavity formed by the conductor 12. The amount of the low-melting point liquid metal A in the accommodation cavity may be set to fill about two thirds of the depth of the accommodation cavity, as long as it is ensured that the low-melting point liquid metal A does not overflow from the accommodation cavity. Because the inner diameter of the accommodation cavity is slightly greater than the maximum diameter of the solder ball B, the depth of the accommodation cavity is greater than the spherical radius of the solder ball B, the chip module 200 can be pressed to enable the solder ball B to enter the accommodation cavity, so that the low-melting point liquid metal A submerges the solder ball B over the centre of sphere. The low-melting point liquid metal A submerges over the centre of sphere, so that a safe distance for the chip module 200 to keep electrical connection upon shaking is longer. That is to say, when the chip module 200 being shocked drives the solder ball B to shift upwards to a certain extent, horizontal sides of the solder ball B are still adhered with a part of the low-melting point liquid metal A, and the low-melting point liquid metal A keeps in electrical contact with the conductor 12 on the side wall of the accommodation hole 10, thereby ensuring the stable electrical connection between the solder ball B and the electrical connector 100 without generating transient open circuit, and avoiding the horizontal sides of the solder ball B from scraping and damaging the conductor 12 on the side wall of the accommodation hole 10. Moreover, when the solder ball B enters the accommodation hole 10, the low-melting point liquid metal A wraps the surface of the solder ball B, so as to isolate the contact area from the air, thereby avoiding oxidation of the contact area.

Referring to FIG. 2, in one embodiment, a manufacturing method of the electrical connector 100 includes the following steps.

First, providing an insulating body 1, and opening a plurality of penetration holes 11 having a smaller aperture on the lower surface of the insulating body 1.

Next, coating a layer of metal conductive substance on the wall surface of the penetration hole 11, so as to form the conducting line 13, and further extending the conducting line 13 downwards to the lower surface of the insulating body 1 to form a solder pad 14.

After that, providing a plug 15, where the size of the plug 15 matches with the aperture of the penetration hole 11, and plugging the plug 15 into the penetration hole 11, so that the top of the penetration hole 11 is sealed by the plug 15.

Then, opening, on the upper surface of the insulating body 1, accommodation holes 10 having a larger aperture and correspondingly located above the penetration holes 11, and coating the metal conductive substance on a side wall and the bottom of the accommodation holes 10 to form the conductor 12. The conductor 12 is electrically connected to the conducting line 13, and the conductor 12 forms a cup-shaped accommodation cavity.

Then, placing low-melting point liquid metal A into each accommodation hole 10, specifically, solidifying the low-melting point liquid metal A into particles in an environment lower than the melting point, placing the particles in each accommodation hole 10, and placing the insulating body 1 at the room temperature (that is an environment higher than the melting point), so that the particles restore to liquid to fill the accommodation hole 10.

Then, providing an elastic sealing layer 4 having a plurality of through holes 40, and adhering the elastic sealing layer 4 on the upper surface of the insulating body 1, so that the through holes 40 of the elastic sealing layer 4 are corresponding to the openings of the accommodation holes 10.

Finally, providing a cover 5, and covering the cover 5 above the elastic sealing layer 4, so that the opening of each of the accommodation holes 10 is partially sealed by the cover 5.

Figure 7:
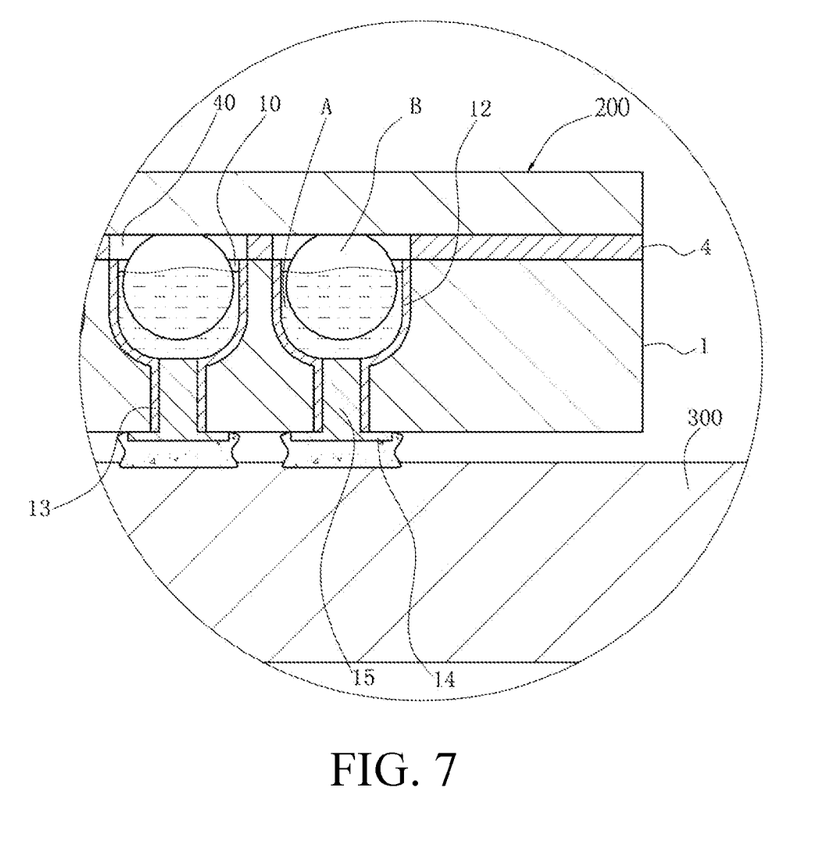
FIG. 7 is a schematic view of a second embodiment of an electrical connector according to one embodiment of the present invention.

FIG. 7 shows a second embodiment of an electrical connector 100 according to the present invention, which has a structure substantially the same as that of the first embodiment, and a difference lying in that: the plug 15 is made of a metal material, and extends integrally downwards to exceed the lower surface of the insulating body 1 to form the solder pad 14 so as to be electrically connected to the circuit board 300. The manufacturing method thereof is substantially the same as the method in the first embodiment, and a difference lies in that, in this embodiment, in the step of coating a layer of metal conductive substance on the wall surface of the penetration hole 11, it is unnecessary to further extend the conducting line 13 formed on the wall surface of the penetration hole 11 downwards to the lower surface of the insulating body 1 to form the solder pad 14, and the plug 15 is directly plugged into the penetration hole 11.

Figure 8:
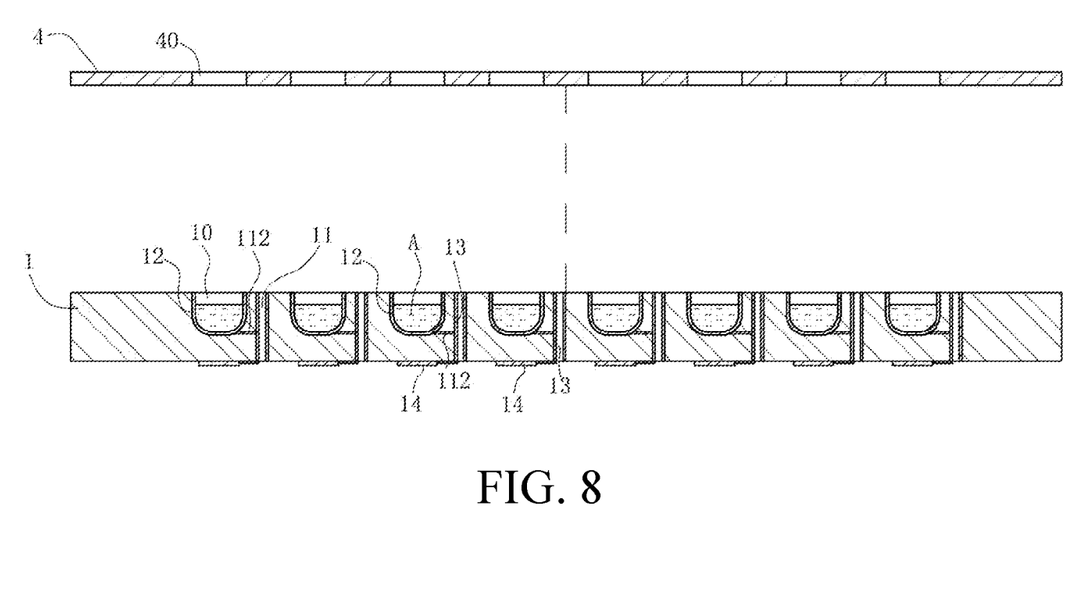
FIG. 8 is a schematic view of a third embodiment of an electrical connector according to one embodiment of the present invention.

FIG. 8 is a third embodiment of the electrical connector 100 according to the present invention, which has a structure substantially the same as the electrical connector 100 of the first embodiment, and a difference lying in that: the accommodation hole 10 is a blind hole. The penetration hole 11 penetrating the insulating body 1 is opened beside the accommodation hole 10. The conducting line 13 is distributed fully on the wall surface of the penetration hole 11 and extends downwards to the lower surface of the insulating body 1 to form the solder pad 14. The conducting line 13 is electrically connected to the conductor 12 in the accommodation hole 10 through a metal line 112, and the metal line 112 is disposed inside the insulating body 1. In another embodiment, the metal line 112 may also be disposed on the upper surface of the insulating body 1. In this embodiment, the insulating body 1 may be a circuit board, and the metal line 112 is a copper foil disposed inside the circuit board.

The manufacturing process of the electrical connector 100 in this embodiment is slightly different. When the electrical connector 100 is manufactured, the accommodation hole 10 and the penetration hole 11 may be manufactured at the same time, and the conductor 12 and the conducting line 13 may also be manufactured at the same time. In addition, during the manufacturing, it is unnecessary to plug the bottom of the accommodation hole 10 by using the plug 15. The specific manufacturing process of this embodiment includes the following steps.

First, providing an insulating body 1, and opening a plurality of accommodation holes 10 on the upper surface of the insulating body 1, the accommodation holes 10 being blind holes; opening a penetration hole 11 having a smaller aperture beside each of the accommodation holes 10, where the penetration hole 11 penetrates the insulating body 1, and a metal line 112 is disposed between the penetration hole 11 and the accommodation hole 10 beside the penetration hole 11.

Next, coating a layer of metal conductive substance on the wall surface of the accommodation hole 10 and the wall surface of the penetration hole 11, so as to form the conductor 12 in the accommodation hole 10, where the conductor 12 forms a cup-shaped accommodation cavity; forming the conducting line 13 in the penetration hole 11, where the conducting line 13 is distributed fully on the wall surface of the penetration hole 11 and is electrically connected to the conductor 12 in the accommodation hole 10 through the metal line 112; and further extending the conducting line 13 downwards to the lower surface of the insulating body 1 to form a solder pad 14.

Then, placing low-melting point liquid metal A into each accommodation cavity, specifically, solidifying the low-melting point liquid metal A into particles in an environment lower than the melting point, placing the particles in each accommodation cavity, and placing the insulating body 1 at the room temperature (that is an environment higher than the melting point), so that the particles restore to liquid to fill the accommodation cavity.

Then, providing an elastic sealing layer 4 having a plurality of through holes 40, and adhering the elastic sealing layer 4 on the upper surface of the insulating body 1, so that the through holes 40 of the elastic sealing layer 4 are corresponding to the openings of the accommodation holes 10.

Finally, providing a cover 5, and covering the cover 5 above the elastic sealing layer 4, so that the opening of each of the accommodation holes 10 is partially sealed by the cover 5.

In view of the above, among other things, the present invention has the following beneficial advantages.

1. The aperture of the accommodation hole 10 is greater than the outer diameter of the solder ball B, so when the chip module 200 is pressed down, the solder ball B will not impact the conductor 12 on the side wall of the accommodation hole 10, thereby avoiding the horizontal sides of the solder ball B from scraping and damaging the conductor 12.

2. The low-melting point liquid metal A is placed into the accommodation hole 10 for being electrically connected to the conductor 12, so when the solder ball B enters the accommodation hole 10, the low-melting point liquid metal A adheres to and contacts with the solder ball B, and the low-melting point liquid metal A forms a conductive path between the solder ball B and the conductor 12. By means of the manner of establishing a conductive path through the low-melting point liquid metal A, when the chip module 200 shakes under an external force, the surface of the solder ball B is at least locally adhered with the low-melting point liquid metal A, so that transient open circuit between the solder ball B and the electrical connector 100 may be avoided, and the chip module 200 still keeps electrical connection with the circuit board 300 through the conductor 12, thereby ensuring desirable signal transmission between the chip module 200 and the circuit board 300.

3. Moreover, using the low-melting point liquid metal A as the conductive path between the chip module 200 and the circuit board 300 avoids the problem of soaring resistance caused by friction oxidation in a conventional elastic terminal, and relatively reduces the contact resistance between the electrical connector 100 and the solder ball B, thereby being capable of improving the electrical contact performance between the chip module 200 and the electrical connector 100.

4. The low-melting point liquid metal A can further functions to seal. When the solder ball B enters the accommodation hole 10, the low-melting point liquid metal A wraps the periphery of the contact area of the solder ball B, so as to seal the contact area to isolate the contact area from being in contact with the external air or water or the like, thereby achieving the objective of preventing oxidation of the contact area, and finally implementing the effect of preventing transient open circuit of the electrical connection between the solder ball B and the electrical connector 100.

5. The depth of the accommodation hole 10 is greater than the spherical radius of the solder ball B, the amount of the low-melting point liquid metal A may be controlled, so that the solder ball B is emerged in the low-melting point liquid metal A deeper, thereby forming a longer safe distance, ensuring the stable electrical connection between the solder ball B and the electrical connector 100 without generating transient open circuit, and avoiding the horizontal sides of the solder ball B from scraping and damaging the conductor 12 on the side wall of the accommodation hole 10.

6. In addition, an R angle is set at the bottom of the accommodation hole 10. That is to say, a transition portion between the side wall and bottom of the accommodation hole 10 is set to be arc-shaped, so as to reduce the volume of the accommodation hole 10 as much as possible, thereby ensuring that the low-melting point liquid metal A can submerge the solder ball B above the center of sphere while reducing the amount of the low-melting point liquid metal A as much as possible, and being capable of saving the amount of the low-melting point liquid metal and reducing the cost while guaranteeing the electrical connection.

7. The elastic sealing layer 4 is disposed above the insulating body 1, so the elastic sealing layer 4 can prevent the low-melting point liquid metal A in the accommodation hole 10 from leaking, thereby further preventing the conductive low-melting point liquid metal A in adjacent accommodation holes 10 from adhering to each other, and avoiding the short circuit phenomenon of the low-melting point liquid metal A in the adjacent accommodation holes 10.

8. The cover 5 is disposed above the elastic sealing layer 4, and the cover 5 may further prevent the low-melting point liquid metal A from leaking; and the portion of the cover 5 corresponding to the accommodation hole 10 is transparent, thus facilitating detection of optical equipment to see whether each of the accommodation holes 10 is provided with the low-melting point liquid metal A.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, for electrically connecting a first electronic element to a second electronic element, a bottom of the first electronic element having a plurality of conductive portions exposed thereof, the electrical connector comprising:
    an insulating body, located below the first electronic element and above the second electronic element, wherein an upper surface of the insulating body comprises a plurality of accommodation holes, and a conductor is provided in the accommodation hole for electrically conducting to the second electronic element; and
    an elastic sealing layer disposed between the insulating body and the first electronic element,
    wherein the accommodation hole comprises a low-melting point liquid metal for conducting the conductor, and when the conductive portion enters the accommodation hole, the low-melting point liquid metal adheres to and contacts with the conductive portion, so that the low-melting point liquid metal forms a conductive path between the conductive portion and the conductor; and
    wherein when the first electronic element is pressed down, the elastic sealing layer is compressed to prevent the low-melting point liquid metal from leaking.

2. The electrical connector according to claim 1, wherein the low-melting point liquid metal wraps a periphery of a contact area of the conductive portion, to isolate the contact area from contacting with the air.

3. The electrical connector according to claim 1, wherein the elastic sealing layer comprises a plurality of through holes corresponding to the accommodation holes, for the conductive portions to pass through, and when the first electronic element is pressed down, an upper surface and a lower surface of the elastic sealing layer are closely attached to the lower surface of the first electronic element and the upper surface of the insulating body respectively.

4. The electrical connector according to claim 1, further comprising a cover covering the upper surface of the insulating body, wherein the cover seals openings of the accommodation holes.

5. The electrical connector according to claim 1, wherein a solder pad is disposed on a lower surface of the insulating body for electrically connecting to the second electronic element, and the solder pad is electrically conducted to the conductor.

6. The electrical connector according to claim 1, wherein a transition portion between a side wall and a bottom of the accommodation hole is arc-shaped.

7. The electrical connector according to claim 1, wherein the low-melting point liquid metal adheres to and contacts with a solder ball disposed at the bottom of the first electronic element.

8. The electrical connector according to claim 4, wherein a portion of the cover corresponding to the accommodation hole is transparent.

9. The electrical connector according to claim 5, wherein the insulating body further comprises a penetration hole penetrating the lower surface of the insulating body, the penetration hole is in communication with the accommodation hole, the conductor is disposed on a side wall and a bottom of the accommodation hole, and a conducting line is disposed on the wall surface of the penetration hole, with two ends of the conducting line electrically connected to the conductor and the solder pad respectively.

10. The electrical connector according to claim 5, wherein the accommodation hole is a blind hole, the conductor is disposed on a side wall and a bottom of the accommodation hole, the insulating body further comprises a penetration hole penetrating vertically through the insulation body, and a conducting line is disposed on the wall surface of the penetration hole, and one end of the conducting line is electrically connected to the conductor in the accommodation hole through a metal line, the other end of the conducting line is electrically connected to the solder pad.

11. The electrical connector according to claim 7, wherein a depth of the accommodation hole is greater than a spherical radius of the solder ball.

12. The electrical connector according to claim 9, wherein the penetration hole comprises a plug for preventing the low-melting point liquid metal from leaking out of the accommodation hole downwards.

13. The electrical connector according to claim 12, wherein a bottom of the plug does not exceed the lower surface of the insulating body downwards.

14. The electrical connector according to claim 12, wherein the plug is made of a metal material, and the bottom of the plug extends downwards to form the solder pad.

15. A manufacturing method of an electrical connector used for electrically connecting a first electronic element to a second electronic element, the bottom of the first electronic element having a plurality of conductive portions protruding thereof, comprising:
- (s1) providing an insulating body, opening a plurality of accommodation holes on an upper surface of the insulating body, wherein an aperture of the accommodation hole is greater than an outer diameter of the conductive portion, and opening, in the insulating body, a plurality of penetration holes penetrating a lower surface of the insulating body;
- (s2) coating a layer of metal substrate on wall surfaces of the accommodation hole and the penetration hole, to form a conductor and a conducting line respectively, wherein the conducting line is electrically connected with the conductor, and extends downwards to be electrically connected with the second electronic element;
- (s3) placing a low-melting point liquid metal in the accommodation hole, wherein the low-melting point liquid metal is conducted with the metal layer, and electrically connected with the conductive portion entering the accommodation hole; and
- (s4) disposing an elastic sealing layer on the upper surface of the insulating body, wherein the elastic sealing layer comprises a plurality of through holes corresponding to the accommodation holes, for the conductive portions to pass through, and when an electronic element is pressed down on the elastic sealing layer, the elastic sealing layer is compressed to prevent the low-melting point liquid metal from leaking.

16. The manufacturing method of claim 15, wherein in step (s3), the low-melting point liquid metal is solidified into particles and then placed into the accommodation hole.

17. The manufacturing method of claim 15, wherein
- in step (s1), the penetration hole is opened below and in communication with the accommodation hole; and
- in step (s2), the metal layer is coated in the penetration hole to form the conducting line, a plug is plugged in the penetration hole to seal the bottom of the accommodation hole, the metal layer is coated in the accommodation hole to form the conductor, and the conductor is electrically connected with the conducting line.

18. The manufacturing method of claim 15, wherein the conducting line extends downwards to the lower surface of the insulating body to form the solder pad for electrically connecting to the second electronic element.

19. The manufacturing method of claim 15, further comprising:
disposing a cover on the upper surface of the insulating body.

20. The manufacturing method of claim 17, wherein the plug is made of a metal material, and electrically connected with the conducting line, and the plug extends downwards to the lower surface of the insulating body to form the solder pad for electrically connecting to the second electronic element.

* * * * *